(12) United States Patent
Ishibashi

(10) Patent No.: US 7,609,732 B2
(45) Date of Patent: Oct. 27, 2009

(54) METHOD FOR CONTROLLING A TEMPERATURE OF A THERMO-ELECTRIC COOLER AND A TEMPERATURE CONTROLLER USING THE SAME

(75) Inventor: Hiroto Ishibashi, Yokohama (JP)

(73) Assignee: Sumitomo Electric Industries Ltd., Osaka (JP)

(*) Notice: Subject to any disclaimer, the term of this patent is extended or adjusted under 35 U.S.C. 154(b) by 208 days.

(21) Appl. No.: 11/905,179

(22) Filed: Sep. 27, 2007

(65) Prior Publication Data
US 2009/0147810 A1    Jun. 11, 2009

(30) Foreign Application Priority Data
Sep. 28, 2006   (JP) ............................. 2006-265311

(51) Int. Cl.
*H01S 3/04*   (2006.01)
(52) U.S. Cl. ............................ 372/34; 372/36; 257/675; 257/712; 62/3.2
(58) Field of Classification Search ............... 372/34, 372/36; 257/675, 712
See application file for complete search history.

(56) References Cited

U.S. PATENT DOCUMENTS

| | | | |
|---|---|---|---|
| 5,499,258 A | | 3/1996 | Kawano et al. |
| 5,978,395 A | * | 11/1999 | Nomura ....................... 372/34 |
| 6,891,867 B2 | * | 5/2005 | Serizawa ................. 372/29.02 |
| 7,075,047 B2 | * | 7/2006 | Noguchi et al. ............. 250/205 |

FOREIGN PATENT DOCUMENTS

JP    2003-298524    10/2003

* cited by examiner

*Primary Examiner*—Minsun Harvey
*Assistant Examiner*—Tod T Van Roy
(74) *Attorney, Agent, or Firm*—Smith, Gambrell & Russell, LLP

(57) ABSTRACT

The present invention is to provide a control algorithm of a thermo-electric cooler (TEC) for a laser diode (LD) where a rush current accompanied with the stepwise change of the target temperature of the TEC. First, the controller stops the TEC driver prior to the setting of the target temperature, and sets the present temperature of the LD. Subsequently, the controller gradually increases the reference temperature of the TEC in stepwise to the target temperature. Thus, the controller suppresses the rush current accompanied with the instantaneous increase of the reference temperature of the TEC.

6 Claims, 3 Drawing Sheets

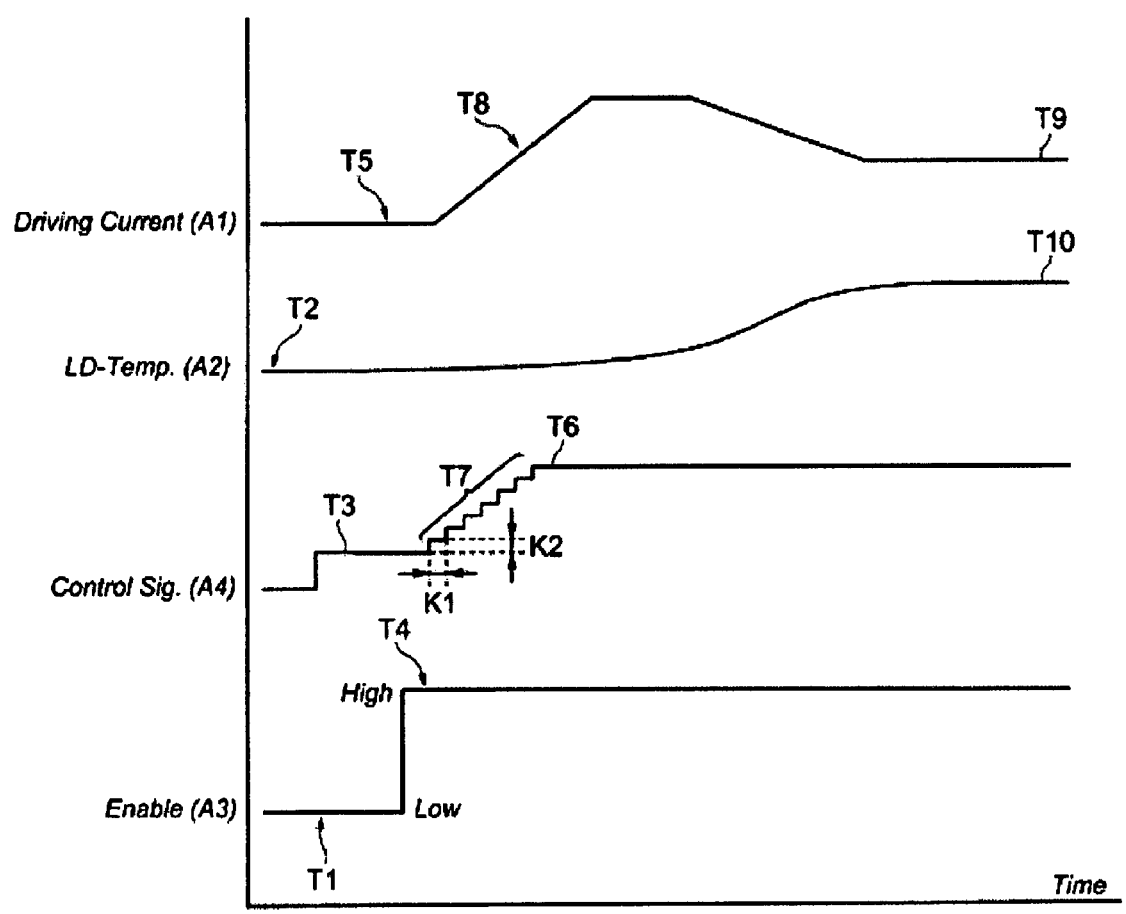

METHOD FOR CONTROLLING A TEMPERATURE OF A THERMO-ELECTRIC COOLER AND A TEMPERATURE CONTROLLER USING THE SAME

BACKGROUND OF THE INVENTION

1. Field of the Invention

The present invention relates to a method to control a temperature of a laser diode (hereafter denoted as LD) with a thermo-electric controller and a temperature controller that uses the method above.

2. Related Prior Art

Various techniques have been well known to control a temperature of the LD, where the LD is applied in an optical communication with a long range and in a dense wavelength division multiplexed communication. In such application, the emission wavelength of the LD is necessary to be precisely controlled, and a thermo-electric cooler (hereafter denoted as TEC) such as Peltier element has been generally used. The TEC has been feedback controlled by an automatic temperature control (hereafter denoted as ATC) driver in the prior arts.

However, when the target temperature of the TEC and the current temperature thereof are widely different, the TEC-driver is going to supply a large current in the TEC to make the temperature of the TEC close to the target temperature, which is generally called as the rush current. A conventional LD controller has provided a function to limit the rush current, that is, the maximum current able to be brought out from the TEC driver.

Recently, some standards concerning to the control of the LD, in particular the emission wavelength thereof, have ruled the maximum rate of the increment of the TEC driving current. As described, although various circuits that limit the maximum driving current have been well know, any circuit has not realized to restrict the maximum rate of the increment of the TEC driving current.

BRIEF SUMMARY OF THE INVENTION

Thus, one aspect of the present invention relates to a method to set a thermo-electric cooler (TEC) in a target temperature by an automatic temperature control (hereafter denoted as ATC) circuit constituted of a temperature sensor and a driver. The temperature sensor senses a temperature of the TEC, while, the driver generates a driving current of the TEC bases on the temperature of the TEC and a preset reference temperature.

The method comprises steps of: (a) disabling the driver, (b) detecting a current temperature of the TEC, (c) setting the preset reference temperature in the current temperature, (d) enabling the driver and (e) gradually increasing the preset reference temperature to the target temperature. Because the method of the present invention is thus configured, no rush current is provided to the TEC even when the target temperature is apart from the current temperature, and the increasing rate of the driving current may be optionally controlled. The preset reference temperature may be gradually increased in stepwise to the target temperature, or preferably via an integration of a stepwise function.

Another aspect of the present invention relates to an apparatus to set a temperature of the LD in a target temperature. The apparatus includes a TEC where the LD is mounted thereon, a temperature sensor, a driver and a controller. The temperature sensor monitors the temperature of the TEC. The driver provides a driving current to the TEC based on a comparison between the current temperature of the TEC and a preset reference temperature. The controller provides the preset reference temperature to the driver.

In the apparatus according to the present invention, the controller may be configured, when the new target temperature is set, to disable the driver, to decide the current temperature of the TEC, to set the preset reference temperature in the current temperature of the TEC, to enable the driver, and to increase the preset reference temperature in gradual to the new target temperature.

Because the apparatus is thus configured, no rush current is provided to the TEC even when the new target temperature is apart from the current temperature of the TEC. Moreover, the increasing rate of the driving current may be optionally controlled by the controller. The preset reference temperature may be increased in stepwise to the new target temperature, or preferably via an integration of a stepwise function.

BRIEF DESCRIPTION OF DRAWINGS

FIG. 3 is a time chart of respective signal in the LD controller and the temperature of the LD.

DETAILED DESCRIPTION OF INVENTIONS

Next, preferred embodiments according to the present invention will be described in detail. In the description of drawings, the same symbols or the same numerals will refer to the same elements without overlapping explanations.

Figure 1:
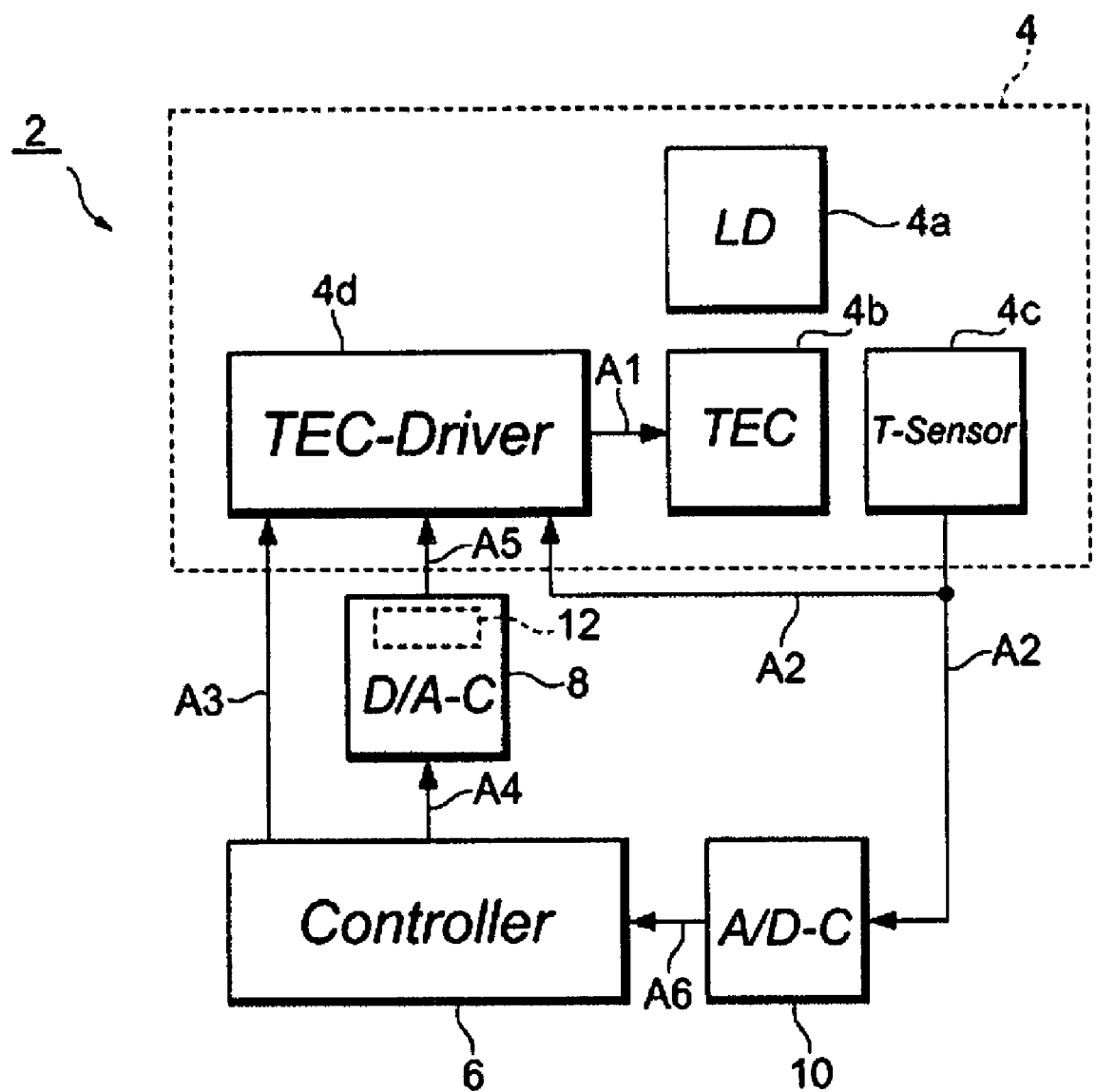
FIG. 1 is a block diagram of the LD controller according to an embodiment of the inventions.

FIG. 1 is a block diagram of the laser diode controller (hereafter denoted as LD controller) 2 according to an embodiment of the present invention. Although not illustrated in the figure, the optical data link installs the LD controller shown in FIG. 1 in the optical transmitting section thereof. The LD controller 2 includes an automatic temperature control (hereafter denoted as ATC) circuit 4, a controller 6, a digital-to-analog converter (hereafter denoted as D/A-C) 8, and an analog-to-digital converter (hereafter denoted as A/D-C) 10.

The ATC 4 includes an LD 4a, a thermo-electric control element (hereafter denoted as ATC element) 4b, a temperature sensor 4c and a TEC-driver 4d. The LD 4a emits light by supplying a driving current from an LD-driver, which is not illustrated in FIG. 1. The TEC element 4b, which may be a Peltier element, cools down or heats up the LD 4a. The TEC element 4b may operate by supplying a driving current A1 from the TEC-driver 4d, a direction of which determines the operation of the TEC element 4b, namely, cooling down or heating up the LD 4a.

The temperature sensor 4c monitors the temperature of the LD 4a, and may be a thermistor. The temperature sensor 4c outputs an analog signal A2 to the TEC-driver 4d and the A/D-C 10. The TEC-driver 4d drives the TEC-element 4b by supplying the current A1 thereto. The TEC-driver 4d is configured to sense the temperature of the LD 4a through the analog signal A2 output from the temperature sensor 4c, to compare thus received temperature with a reference temperature or a target temperature output from the controller 6 through the D/A-C 8, and to drive the TEC element 4b so as to reduce a difference between the sensed temperature of the LD 4a, which is reflected in the analog signal A5, and the reference temperature or the target temperature. Thus, the larger the difference therebetween, the magnitude of the driving current A1 and the decreasing rate or the increasing rate of the driving current becomes large.

The controller 6 controls the ATC circuit 4. Details of the algorithm to control the ATC circuit 4 will be described later. The controller 6 decides the temperature of the LD 4a from the digital signal A6 output from the A/D-C 10. The digital signal A6 corresponds to the analog signal A2 output from the temperature sensor 4c. The controller 6 outputs the control signal A3 to the TEC-driver 4d to turn on or off of the TEC-driver 4d and to decide the direction of the driving current A1.

The D/A-C 8 converts the digital signal A4 output from the controller 6 into a corresponding analog signal A5 and provides this analog signal A5 to the TEC-driver 4d. While, the A/D-C 10 converts the analog signal A2 output from the temperature sensor 4c into a corresponding digital signal A6 and provides this digital signal A6 to the controller 6.

Figure 2:
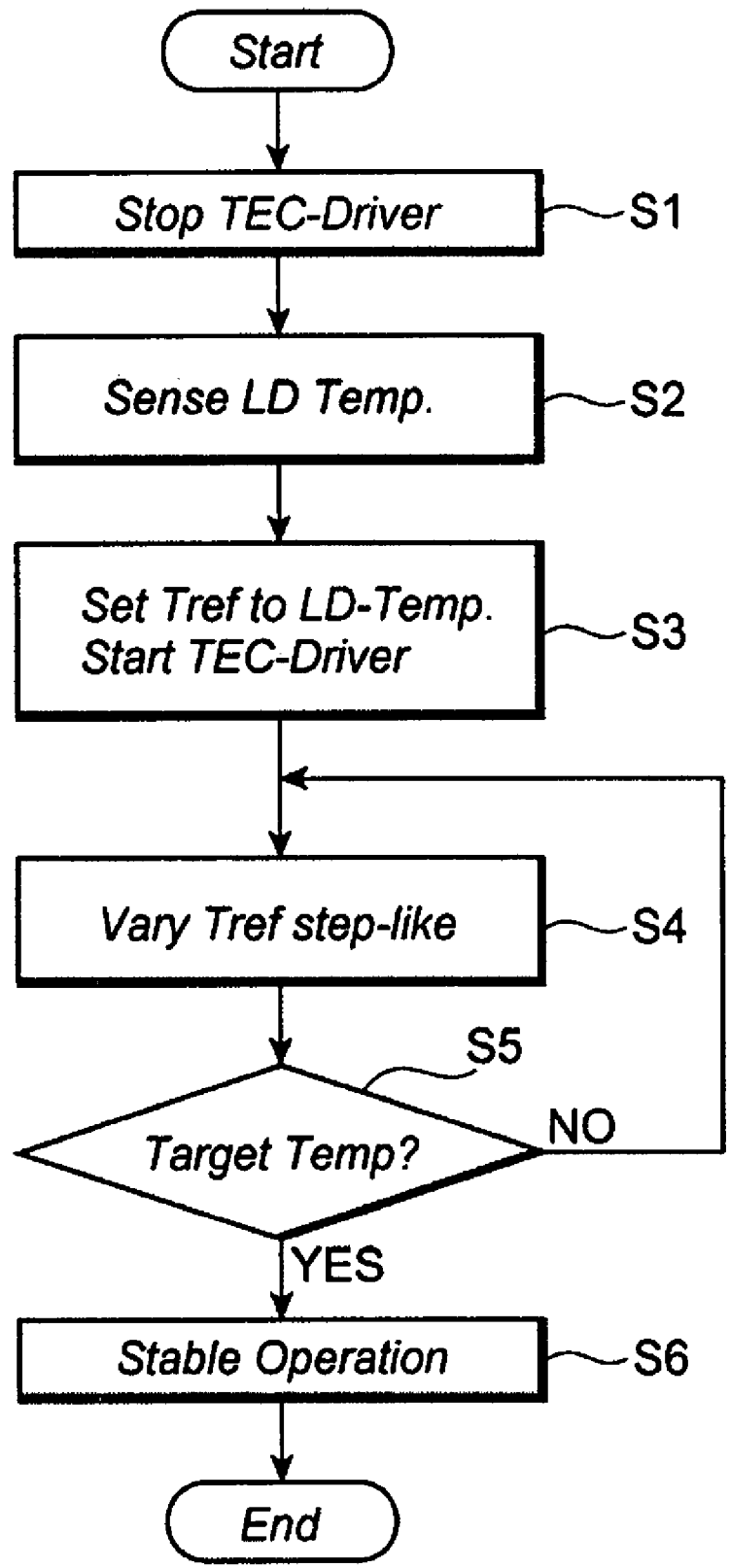
FIG. 2 is a flow chart describing the control protocol of the present invention.

Next, an algorithm of the LD controller 2 will be described as referring to FIGS. 2 and 3. FIG. 2 is a flow chart to explain the operation of the controller 6, while FIG. 3 is a time-chart of the process in the controller 6. First, the controller 6 decides the temperature of the LD 4a from the digital signal A6 provided from the A/D-C 10, and calculates the driving current A1 to be supplied to the TEC element 4b based on the thus decided current temperature of the LD 4a.

The controller 6, when the calculated current A1 exceeds a preset limit and the current A1 to the TEC element 4b becomes a type of a rush current, advances the process thereof in accordance with the flow chart shown in FIG. 2. In this case, the controller 6 first stops the operation of the TEC-driver 4d at step S1 and concurrently sets the control signal A3 in the low level, which reflects the disenable state, which is referred by a symbol T1 in FIG. 3. Next, the controller 6 decides the temperature of the LD 4a by the digital signal A6 during the suspension of the TEC-driver at step S2. Thus decided temperature reflects the current temperature of the LD 4a, which may be referred by a symbol T2 in FIG. 3.

Next, the controller 6 sets the reference temperature T3, which is equal to the current temperature of the LD 4a that is decided in step S2, in the TEC-driver 4d as the digital signal A4, and restarts the TEC-driver 4d at step S3. In this step S3, the control signal changes, by the controller 6, from the low level that corresponds to the disenable state to the high level that corresponds to the enable state, which may be referred by a symbol T5 in FIG. 3. Subsequently, the controller 6 sequentially increases the reference temperature T3 to the target temperature T6 in stepwise at steps S4 and S5.

During the increase of the temperature of the LD 4a, the controller 6 finally sets the target temperature by the digital signal A4, which is referred by a symbol T7 in FIG. 3. The driving current A1 increases in stepwise so as to trace the signal A4, which is shown in a symbol T8 in FIG. 3. The step width K1 in a unit of the second and the step height K2 in a unit of the temperature may dominate the magnitude of the driving current A1 and the rate of the increase. The increasing rate of the reference signal is preferable to be 1° C./ms.

The step width K1 (sec) and the step height K2 (Temperature) of the stepwise digital signal A4 depends on the loop gain of the ATC circuit 4. When the loop gain is great, the larger driving current A1 flows at the transition of each step even the reference temperature is increased in stepwise as shown by the symbol T7 in FIG. 3. Accordingly, to suppress the driving current A1 at each transition, it is preferable to set the loop gain of the LD controller 2 to be about 50 mA/T or less. The controller 6 performs the stable operation S3 of the TEC driver 4d with the driving current A1 to be a value T9 and the temperature of the LD 4a to be T10 as shown in FIG. 3 after setting the target temperature T6 in the TEC-driver 4d via the control signal A4.

According to the LD controller 2 described above, the LD controller 2 first sets the reference temperature T3, which is equal to the present temperature of the LD 4a, in the TEC driver 4d via the control signal, after disabling the TEC driver 4d, and subsequently restarts the TEC-driver 4d.

This process may escape the TEC-driver 4d from supplying a rush current accompanied with the restart of the TEC driver 4d. Moreover, to adjust the step width corresponding to the time and the step height corresponding to the temperature may control the magnitude of the driving current A1 and its increasing rate, which suppresses the increasing rate of the driving current A1.

While the preferred embodiments of the present invention have been described in detail above, many changes to these embodiments may be made without departing from the true scope and teachings of the present invention. The present invention, therefore, is limited only as claimed below and the equivalents thereof.

For instance, the D/A-C 8 may integrate an integrating filter 12. This filter may integrate the stepwise control signal provided from the controller 6 and outputs a signal A5 with an analog form. The time constant of this integrating filter 12 may be comparable to the step width K1 of the stepwise signal A4. The control signal A5 with the analog form may become a smoothly increasing signal compared to the stepwise digital signal A4. When the stepwise signal A4 is provided to TEC-driver 4d, the TEC-driver 4d occasionally generates a rush current at the transition of each step K2. However, the integrating filter 12 may smooth increase the control signal A5, which may reduces the rush current.

I claim:

1. A method to set a thermo-electric cooler in a target temperature by an ATC circuit constituted of a temperature sensor configured to sense a temperature of the thermo-electric cooler and a driver configured to generate a driving current of the thermo-electric cooler based on the temperature of the thermo-electric cooler and a preset reference temperature, the method comprising steps of:
   (a) disabling the driver;
   (b) detecting a current temperature of the thermo-electric cooler by the temperature sensor;
   (c) setting the preset reference temperature to the current temperature;
   (d) enabling the driver; and
   (e) gradually increasing the preset reference temperature to the target temperature.

2. The method according to claim 1,
   wherein the step (e) increases the preset reference temperature in stepwise function.

3. The method according to claim 2,
   wherein the step (e) increases the preset reference temperature in accordance with an integration of the stepwise function.

4. An apparatus to set a temperature of a laser diode in a target temperature, comprising:
   a thermo-electric cooler to mount the laser diode thereof;
   a temperature sensor to monitor the temperature of the thermo-electric cooler;
   a driver to provide a driving current to the thermo-electric cooler based on the temperature of the thermo-electric cooler and a preset reference temperature; and
   a controller to provide the preset reference temperature to the driver,
   wherein the controller is configured to disable the driver, to decide a current temperature of the thermo-electric cooler, to set the preset reference temperature to the current temperature, to enable the driver, and to increase the preset reference temperature gradual to the target temperature.

5. The apparatus according to claim 4,
   wherein the controller increases the preset reference temperature in stepwise function to the target temperature.

6. The apparatus according to claim 5,
   wherein the controller increases the preset reference temperature to the target temperature by integrating a stepwise function.

* * * * *